United States Patent [19]
Lee

[11] Patent Number: 5,961,323
[45] Date of Patent: Oct. 5, 1999

[54] DUAL VERTICAL THERMAL PROCESSING FURNACE

[75] Inventor: Chunghsin Lee, Lynnfield, Mass.

[73] Assignee: Eaton Corporation, Beverly, Mass.

[21] Appl. No.: 09/132,591

[22] Filed: Aug. 11, 1998

Related U.S. Application Data

[63] Continuation of application No. 08/702,257, Aug. 23, 1996, Pat. No. 5,820,366
[60] Provisional application No. 60/021,442, Jul. 10, 1996.
[51] Int. Cl.[6] ...................................................... F27D 5/00
[52] U.S. Cl. ............................................. 432/241; 432/253
[58] Field of Search ................................... 432/239, 241, 432/253, 152, 5, 11

[56] References Cited

U.S. PATENT DOCUMENTS

| | | | |
|---|---|---|---|
| 5,041,719 | 8/1991 | Harris et al. ............................. | 219/390 |
| 5,057,287 | 10/1991 | Swiggard ................................ | 422/248 |
| 5,162,047 | 11/1992 | Wada et al. ............................. | 29/25.01 |
| 5,180,273 | 1/1993 | Sakaya et al. .......................... | 414/404 |
| 5,217,501 | 6/1993 | Fuse et al. .............................. | 29/25.01 |
| 5,245,158 | 9/1993 | Hashizume et al. .................... | 219/390 |
| 5,387,265 | 2/1995 | Kakizaki et al. ....................... | 29/25.01 |
| 5,407,350 | 4/1995 | Iwabuchi et al. ....................... | 432/241 |

*Primary Examiner*—Teresa Walberg
*Assistant Examiner*—Gregory A. Wilson
*Attorney, Agent, or Firm*—Lahive & Cockfield, LLP; Anthony A. Laurentano

[57] ABSTRACT

A vertical semiconductor wafer processing furnace that includes a single housing having first and second vertical furnaces each having a heating chamber for heat treating a semiconductor wafer. The first and second vertical furnaces are asymmetrically disposed relative to each other to reduce the overall footprint of the processing furnace. Each vertical furnace includes a wafer support assembly that includes support structure, such as a wafer boat, boat elevator, motor and guide rod, for axially mounting a selected number of semiconductor wafers. A translation element selectively moves one of the support elements along the vertical axis into and out of the process tube, and a wafer transfer element selectively transfers semiconductor wafers to or from one of the support elements. The furnace further includes a heating sleeve or envelope that is adapted to control the ambient fluid environment surrounding the support structure and which is independently movable relative to support structure. The heating sleeve is adapted to sealingly engage a portion of the support element to create a fluid-tight seal forming a loadlock processing assembly. This assembly is coupled to a vertical translation assembly that selectively, vertically moves the processing assembly into the heating chamber of the vertical furnace. Additionally, the heating sleeve an be vertically moved relative to the support structure to engage and disengage repetitively, easily and automatically the heating sleeve relative to the support structure.

36 Claims, 3 Drawing Sheets

DUAL VERTICAL THERMAL PROCESSING FURNACE

RELATED APPLICATION

This application is a continuation application of Ser. No. 08/702,257 filed on Aug. 23, 1996, (now U.S. Pat. No. 5,820,366), which is a continuation-in-part of U.S. Provisional patent application Ser. No. 60/021,442, filed Jul. 10, 1996. The contents of all of the aforementioned application(s) are hereby incorporated by reference.

BACKGROUND OF THE INVENTION

The present invention relates to a thermal processing furnace for processing semiconductor wafers, and particularly to a vertical-type heat processing furnace.

Thermal processing furnaces, also known as diffusion furnaces, have been widely known and used for many years to perform a variety of semiconductor fabrication processes, including annealing, diffusion, oxidation, and chemical vapor deposition. As a result, these processes are well understood, especially with regard to the impact of process variables on the quality and uniformity of resulting products. Thermal processing furnaces typically employ either a horizontal-type furnace or a vertical-type furnace. For some applications, vertical-type furnaces are preferred because they create less particles during use, thus decreasing the incidence of contamination and wafer waste, they can be easily automated, and they require less floor space because of their relatively small footprint.

Both conventional types of diffusion furnaces are designed to heat semiconductor wafers to desired temperatures to promote either diffusion of the dopants to a desired depth while maintaining line width smaller than 1 micron, as known, or to perform other conventional processing techniques such as the application of an oxide layer to the wafer or deposition of a chemical vapor layer to the wafer. The heating requirements of the wafer during processing are known and well understood, and thus are closely monitored.

Conventional vertical-type thermal processing furnaces are designed to support the processing tube within the furnace in the vertical position. The thermal furnace also typically employs a wafer boat assembly which is mounted to appropriate translation mechanisms for moving the wafer boat into and out of the processing tube. A wafer-handling assembly is deployed adjacent and parallel to the wafer-boat assembly to transfer the semiconductor wafers from wafer cassettes, which typically hold up to 100 wafers, to the wafer-boat assembly. The wafer-handling assembly is typically located in a loadlock chamber separate from the chamber housing the process tube, and whose environment is closely controlled by appropriate monitoring structure. The loadlock mounting the wafer-handling assembly can also be isolated from the wafer cassettes, such as by mounting the wafer cassettes in one or more loadlocks that are in selected fluid communication with the wafer-handling assembly loadlock. The serial chain of loadlocks thus allows the precise environmental control necessary during processing to decrease or eliminate the chance of contaminants being formed in the wafer during heating. The loadlocks are typically separated from each other by gate valves that are selectively opened and closed to allow the transfer of a wafer from the wafer cassette to the wafer boat and vice versa.

In practice, after a vacuum is established in the loadlock chamber mounting the wafer boat, an inert gas such as nitrogen can be introduced to fill the loadlock chamber and to remove air therefrom. This purging of air from the loadlock chamber prevents the formation of natural oxide films on the semiconductor wafer surface. As noted above, the loadlock chamber is connected to other serial loadlocks which house the semiconductor wafers cassettes and the wafer handling assembly, to thus effectuate loading and unloading of the wafer boat in a nitrogen atmosphere. The wafer boat is then loaded with wafers from the wafer cassette via the wafer-handling assembly to form a wafer batch. The batch is then disposed within the furnace, where it undergoes a user-selected process under elevated temperatures. Conventional vertical furnaces of these types are shown and described in U.S. Pat. No. 5,217,501 of Fuse et al. and in U.S. Pat. No. 5,387,265 of Kakizaki et al.

Prior furnaces establish an isothermal zone within the process tube that extends between about 20 inches and about 30 inches, where a wafer batch having between about 150 to 200 wafers is disposed. Due to the relatively large thermal mass associated with this wafer batch, the temperature ramp-up rates are relatively small, for example, between about 5° C./min. and about 10° C./min, and the temperature ramp-down rates are relatively small, for example, between about 2.5° C./min. and about 5° C./min. This results in a relatively long thermal cycle per batch, and thus a relatively large thermal budget per wafer.

Another drawback of these and other conventional vertical-type thermal processing furnaces is that they achieve relatively low throughput because of the increased cycle time per batch. These conventional systems are thus not uniquely situated to accommodate today's ever increasing demands for semiconductor wafers.

Another drawback of these furnaces is that they incorporate pre-staging loadlock assemblies which form air-free environments for the transfer of wafers to and from the wafer boat. The time involved in venting and purging the loadlocks to achieve these states increases the overall processing time per batch and thus serves to further decrease the throughput of the furnace system.

Still another drawback is that these furnaces have a relatively large footprint and occupy relatively large amounts of floor space in clean rooms, thus providing for inefficient use of expensive clean room space.

Due to the foregoing and other shortcomings of prior art vertical-type thermal processing furnaces, an object of the present invention is to provide a vertical-type furnace that provides for relatively high throughput.

Another object of the invention is to provide a furnace that achieves improved temperature ramp-up and ramp-down rates.

Still another object of the invention is to provide a thermal processing furnace that can be easily automated and occupies relatively small floor space.

Other general and more specific objects of the invention will in part be obvious and will in part appear from the drawings and description which follow.

SUMMARY OF THE INVENTION

The present invention provides for a vertical semiconductor wafer processing furnace that includes a single housing having first and second vertical furnaces each having a heating chamber for heat treating a semiconductor wafer. Each vertical furnace includes a wafer support assembly that includes support structure, such as a wafer boat, boat elevator, motor and guide rod, for axially mounting a selected number of semiconductor wafers.

According to one aspect, a translation element selectively moves one of the support elements along the vertical axis into and out of the process tube, and a wafer transfer element selectively transfers semiconductor wafers to or from one of the support elements. According to one preferred practice, there is a translation element associated with each of the wafer support assemblies for moving the support elements along each longitudinal axis and selectively into the heating chamber.

According to another aspect, the furnace includes a control element that is responsive to a control signal, for example, a user-generated control signal, for generating a position signal and for transferring the position signal to the translation element to regulate, e.g., initiate, modify or cease, movement of one of the support structures along the axis in response to the position signal. The control element thus independently or simultaneously controls the rate of movement of each support structure. According to one practice, the control element includes a motion controller that operates in cooperation with a host computer that generates the position signal, the support structure. The control signal applied to the control element can be representative of at least one of a selected temperature ramp-up rate condition and a selected temperature ramp-down rate condition.

According to still another aspect, the translation element can generate a movement signal indicative of the rate of movement of at least one of the first and second support elements, and the control element is responsive to this movement signal and controls the rate of movement of one of the support elements along the longitudinal axis.

According to still another aspect, each vertical furnace, e.g., the first and second vertical furnaces, includes a heat generating element that transfers heat to each corresponding processing chamber. The control element can independently or simultaneously control the temperature of the first and second processing chambers by regulating the thermal energy output of each heat generating elements. According to one practice, the control element can regulate the heat generating elements to attain a substantially uniform temperature along at least a portion of the chamber to form a substantially isothermal environment.

According to another aspect, the furnace includes a heating sleeve or envelope that is adapted to control the ambient fluid environment surrounding the support structure, e.g., the wafer boat. The heating sleeve includes a flanged bottom portion that is adapted to sealingly engage a portion of the support element to create a fluid-tight seal forming a load-lock processing assembly. This assembly is coupled to a vertical translation assembly that selectively, vertically moves the processing assembly into the heating chamber of the vertical furnace. According to a preferred embodiment, a heating sleeve is associated with each vertical furnace. Additionally, the heating sleeve can be vertically moved relative to the support structure to engage and disengage repetitively and easily and automatically the heating sleeve relative to the support structure.

When the heating sleeve is disposed over the support structure and sealingly engages the bottom portion of the support structure, the assembly forms a loadlock processing chamber within which selected processing techniques can be performed. This chamber can be coupled to appropriate fluid manifolding to introduce one or more selected gases to the chamber and to evacuate one or more gases.

The use of dual heating envelopes and furnaces in a single thermal processing furnace allows the furnace to perform two separate processing techniques separately and independently, thus increasing the furnace's flexibility of use. The furnace further achieves increased ramp-up and ramp-down rates, reducing the total time necessary to process a wafer batch, thus increasing the total furnace throughput. This is all achieved by packaging dual furnaces in a single housing having small dimensions and by employing wafer boats that have increased wafer pitch and that process smaller batch sizes.

Other general and more specific objects of the invention will in part be obvious and will in part be evident from the drawings and description which follow.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DESCRIPTION OF ILLUSTRATED EMBODIMENTS

Figure 1:
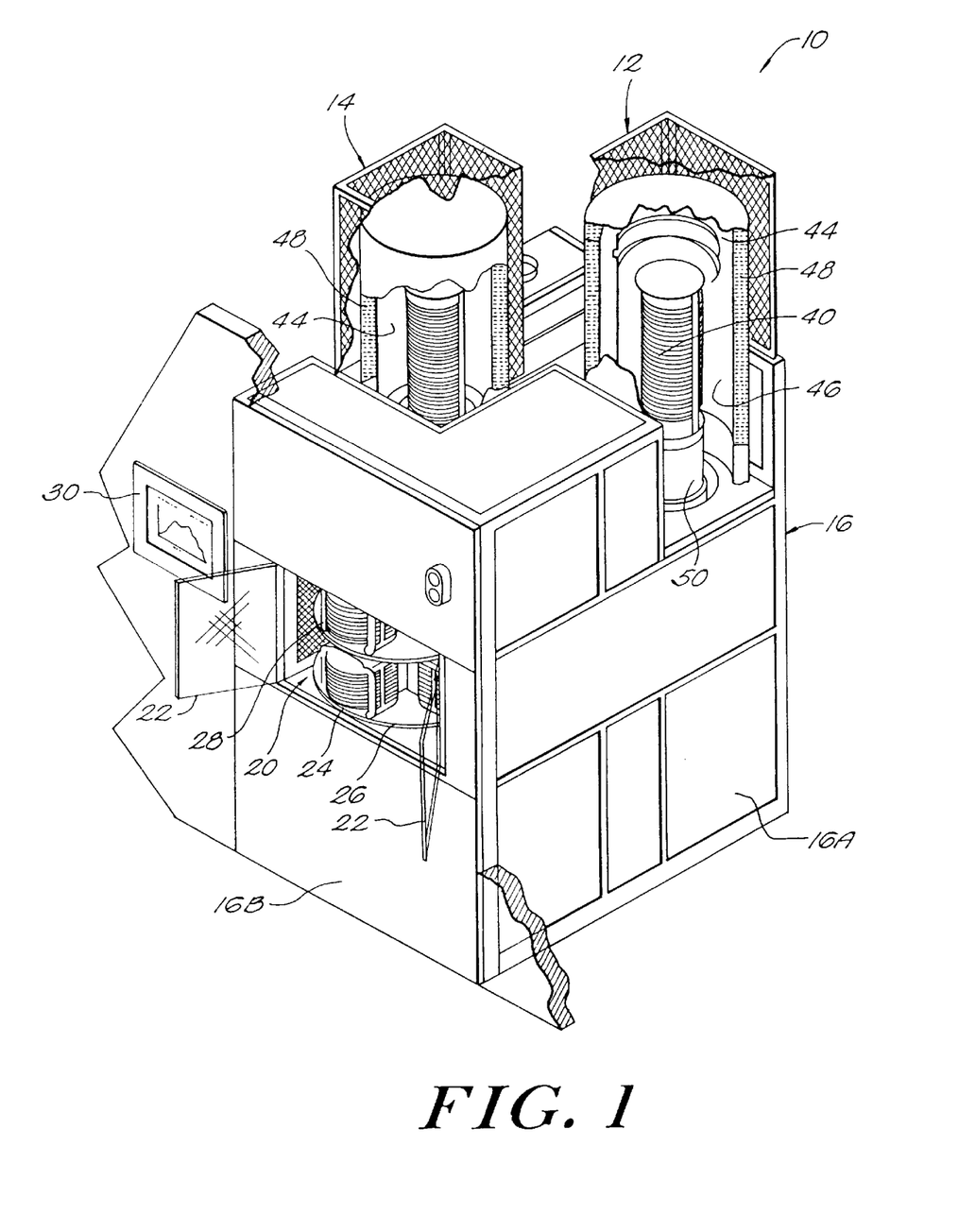
FIG. 1 is a plan view of the thermal processing furnace according to the present invention.

FIG. 1 illustrates a perspective view of the vertical-type thermal processing furnace 10 of the present invention illustrating in partly broken view the dual vertical furnaces 12 and 14 according to one aspect of the present invention. The thermal processing furnace 10 is designed to be compact and to have a relatively small footprint. For example, according to one embodiment of the invention, the furnace can be about 40 inches wide by about 65 inches deep, and has a height of about 96.5 inches. The furnace is typically used to perform a variety of semi-conductive fabrication processes, including annealing, diffusion, oxidation and low and high pressure chemical vapor deposition.

The illustrated thermal processing furnace 10 includes a main outer housing 16 that encloses a pair of vertical furnaces 12 and 14. The housing 16 includes a plurality of sides 16A and a front face 16B that includes a wafer storage compartment 20. A pair of vertically spaced carousels 28 and 26 which support eight wafer cassettes that hold a selected number of wafers are mounted within compartment 20. These wafers can be unprocessed or processed wafers. Door panels 22 enclose and cover the compartment 20. As shown, a monitor 30 can be mounted within the front face 16B of the housing 16 to allow an operator to monitor selected process control parameters, such as the temperature, process time, types of gas and other selected process control parameters.

Figure 3:
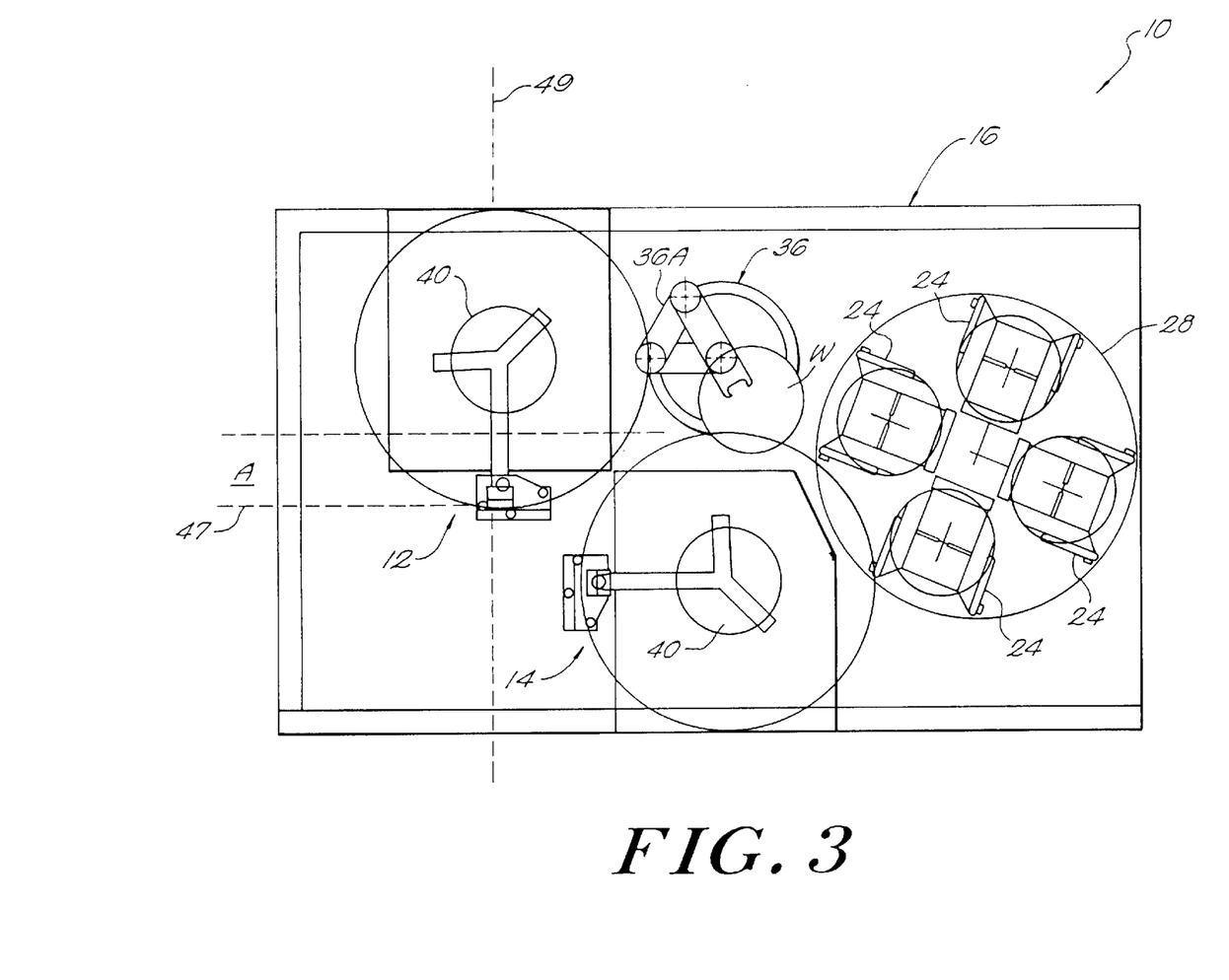
FIG. 3 is a top view of the wafer transfer assembly housed within the thermal processing furnace of FIG. 1, and which further illustrates the asymmetrical furnace arrangement according to the teachings of the present invention.

With reference to FIG. 3, the wafer cassettes 24 are mounted on carousal 28. A three-axis wafer transfer assembly 36 having a mechanical transport arm 36A transports wafer W from a selected cassette 24 to one of the wafer boats 40 disposed in each vertical furnace 12, 14. The carousal 28 can be selectively rotated to position a selected wafer cassette at a position to allow the mechanical transport arm 36 to remove a wafer from or place a wafer on that particular cassette. In this way, the illustrated thermal processing furnace 10 allows for selected control and continuous processing of the wafers during furnace operation. The transfer assembly 36 is preferably vertically movable to allow the transport arm 36 to access the wafer cassettes 24 on either the upper carousel 28 or the lower carousel 26. Those of ordinary skill will readily understand and appreciate the various types of transport assemblies available for use in thermal processing furnaces, as well as the operation of the wafer transfer assembly 36 in conjunction with wafer handling and processing.

Figure 2:
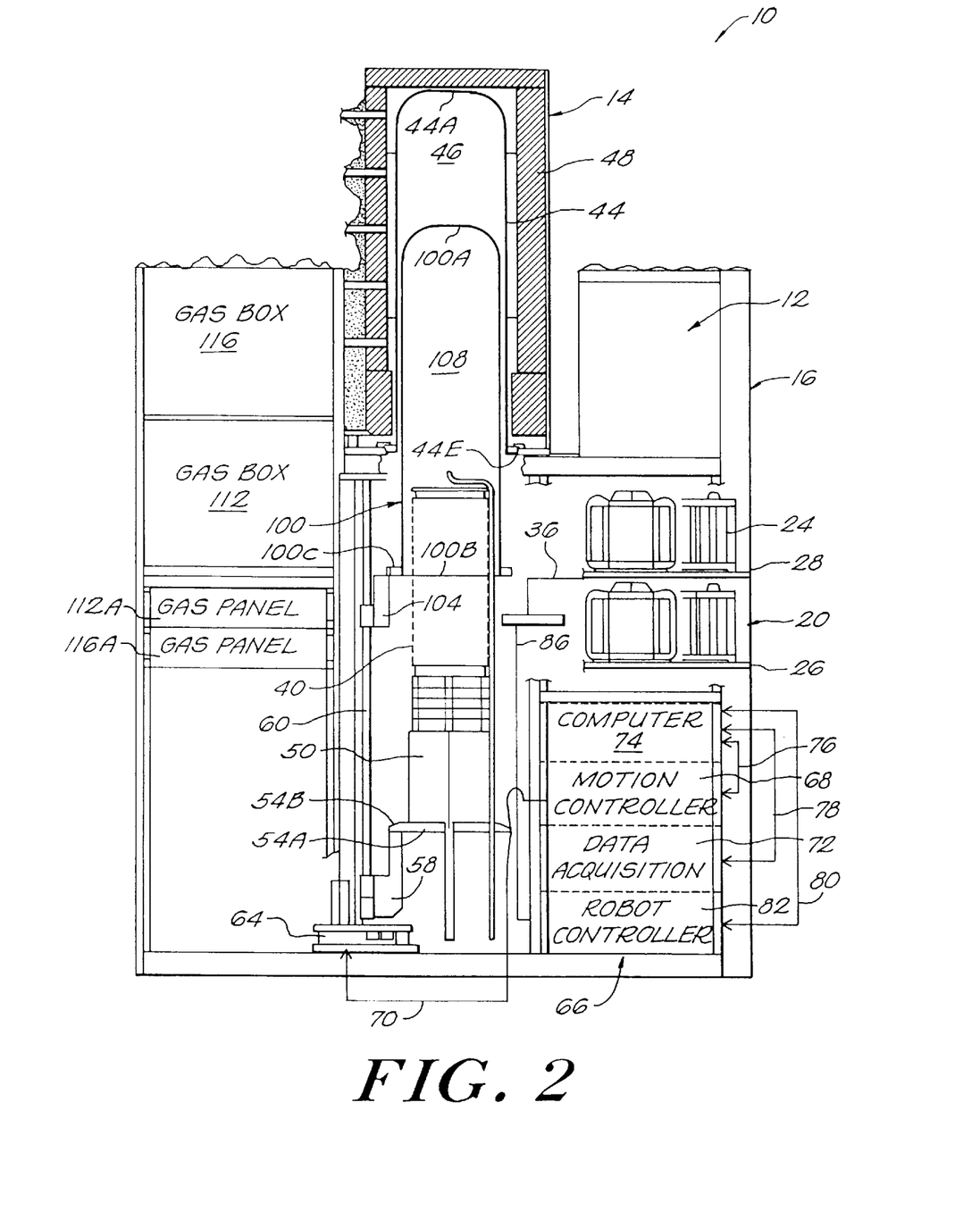
FIG. 2 is a perspective view, partly in cross-section, showing the inner portions of the thermal processing furnace of FIG. 1.

FIGS. 1 through 3, and particularly FIG. 2, illustrate the components of the thermal processing furnace 10 of the present invention. The vertical furnace 14 includes a cylindrical process tube 44 that has a closed end 44A and an opposed open end 44B. The cylindrical tube 44 defines a heating chamber 46. The process tube 44 can be formed of any high temperature material such as alumina, silicon carbide, and other ceramic materials, and is preferably composed of quartz. The process tube is surrounded by a suitable heating element 48 that uses resistance-heated elements or RF heated black body cavity susceptors as the primary heat source. This particular type of heat source is simple to implement, well characterized and widely accepted as a reliable technique for stable and uniform control of the furnace temperature. According to one embodiment, the heating element 48 forms part of a heater module that is a vertical oriented, three zone resistive heated unit. The heating elements can be composed of low mass, high temperature metallic wires. The insulation surrounding the heating element can be composed of ceramic fibers of high insulation value and low thermal mass. All are designed for fast responses to temperature changes. The module can also include an air cooling system to help cool the heating chamber 46. The process tube 44 diameter and thus the size of the vertical furnace can be easily scaled to accommodate wafers of varying sizes.

The heating element 48 is arranged about each process tube 44 to heat the inside of the tube to a predetermined temperature, e.g., 400° C. to 1200° C. in the case of chemical vapor deposition, or 800° C. to 1200° C. in the case of oxidation or diffusion. The control unit 66 can be used to regulate the temperature of the process tube 44 according to the exigencies of the processing technique. For example, according to one practice, a temperature sensor, such as an optical pyrometer, can be used to sense the chamber temperature and can be linked to the control unit 66. The heating unit preferably forms an isothermal heating zone within the heating chamber, as is known in the art.

The housing 16 encloses a wafer support assembly 54 that includes a wafer boat 40 supported by a heat insulating stanchion 50. The bottom portion 54A of the wafer support assembly 54 has an integrally formed and radially outwardly extending flange plate 54B. The illustrated wafer support assembly 54 is coupled to a boat elevator 58 that slidably engages a guide rod 60. The wafer support assembly is thus selectively vertically movable along the vertical axis of the guide rod to selectively move the wafer support assembly into and out of the furnace heating chamber 46.

The vertical furnace 12 is similarly constructed.

The mechanical transport arm 36A of the mechanical transfer assembly 36 selectively moves wafers from a selected cassette 24 mounted on one of the carousels 26, 28 to one of the wafer boats 40 of either furnace 12 or 14. The wafer boat selectively holds a number of wafers to be processed, for example, between about 50 wafers and about 100 wafers, and preferably about 75 wafers. The wafer boat thus holds about half the number of wafers as conventional wafer boats. This reduction in batch size reduces the total thermal mass of the batch, thus increasing the temperature ramp rates of the furnace. With the increased ramp rates, the total time the wafers are exposed to high temperatures is reduced.

The wafers are arranged on the wafer boat at predetermined vertical intervals, known as a wafer pitch, and are preferably separated between 5 mm and about 20 mm, and most preferably between about 10 mm and about 20 mm. This selected wafer pitch provides for relatively large spacing between vertically adjacent wafers, which results in better within wafer and wafer-to-wafer temperature uniformities. In contrast, some prior designs typically employ a wafer pitch of between about 3 mm and 5 mm for standard furnace processing.

A significant advantage of this larger wafer pitch is that it allows for relatively fast temperature ramping of the wafer without suffering wafer uniformity degradation. This larger spacing also relaxes the mechanical tolerances of the mechanical transport arm 36A during loading and unloading of the wafer boat since the arm has a larger space in which to operate. The smaller wafer batch size of the wafer boats presents a smaller semiconductor mass in which to heat during thermal processing. Consequently, the semiconductor wafers can more easily ramp up and ramp down in temperatures, increasing the overall throughput of the system.

Referring again to FIG. 2, a servo motor 64 controls the movement of the boat elevator 58 along the guide rod 60. The servo motor 64 is preferably controlled by the control unit 66, which can include a motion controller 68, via selected signals transferred along electrical lead 70. The illustrated motion controller 68 is further in electrical communication with a host computer 74, as illustrated by data flow pathway 76. Likewise, the computer 74 is also in bidirectional communication with a data acquisition stage, which accumulates selected processing data associated with the thermal processing operation of the illustrated furnace. Data can be transferred between the host computer 74 and the data acquisition stage along data flow pathway 78.

The robot controller 82 is also in bidirectional communication with the computer 74 by way of signal pathway 80, and also transfers selected control signals along electrical lead 86 to the wafer transfer assembly 36. The robot controller thus controls the selected position and relative movement of the transport arm 36A to remove or load a wafer onto a selected cassette 24 mounted on one of the carousels 26, 28.

The computer 74, motion controller 68, data acquisition stage 72, and robot controller 82 thus form a closed loop feedback control stage that selectively raises and lowers the wafer support assembly as well as controls the relative movement of the mechanical transport arm 36A. Those of ordinary skill will appreciate that one or more of the motion controller, data acquisition stage and robot controller can be implemented in hardware and/or software and thus form part of computer 74, rather than provide a separate stage.

The illustrated furnace 10 further includes a heating sleeve 100 that is dimensioned to seat within process tube 44. Similar in construction to the process tube, the heating sleeve 100 is also formed of a high temperature material, e.g., quartz, having a first closed end 100A and an opposed open end 100B. The sleeve open end 100B further includes an outwardly extending flange portion 100C. The heating tube 100 is coupled to a sleeve elevator 104 that slidingly engages the guide rod 60 or other suitable guiding structure. The heating sleeve 100 is movable independently of the wafer support assembly 54.

The relative vertical position of the heating sleeve 100 can be feedback controlled by the motion controller stage 68 of the control unit 66. For example, the motion controller 68 can be used to selectively actuate the servo motor 64 to raise or lower the heating sleeve 100, the wafer support assembly 54, or both simultaneously. The flange 100C of the heating sleeve is adapted to sealingly engage the flange portion 54B of the wafer support assembly 54 to form a fluid-tight and vacuum-tight seal. Thus, when the heating sleeve 100 is disposed over the wafer boat and stanchion 50 and sealingly engages the flange portion 54B of the wafer support assembly 54, the sleeve 100 forms a loadlock processing chamber 108. The heating sleeve 100 cooperates with the wafer support assembly to form an ambient control mechanism for controlling the ambient environment of the wafers mounted in the wafer boat 40 exclusive of the environment of the heating chamber 46 of the process tube 44. The sleeve thus operates, in one selected position, e.g., when the flange 100C sealingly engages flange 54B, as a vertically movable loadlock chamber which is selectively disposable within the heating chamber 46. The heating sleeve 100 can be raised or lowered into the heating chamber 46 along with the wafer support assembly 54, so that the wafers are in a strictly controlled ambient environment during both the temperature ramp-up (heating) or ramp-down (cooling) phase.

Gas manifolding structure can be coupled to the wafer transport assembly 54 and the heating sleeve 100 to control the fluid environment of the loadlock processing chamber 108 associated with furnace 14, FIG. 2. For example, according to one embodiment, a small quartz conduit is coupled to gas box 112 and to the flange plate of the wafer transport assembly 54 to transport a selected process gas contained within the gas box to the top of the process chamber 108. The process gas passes over the wafer boats, through suitable exhaust ports, e.g., located at the bottom of the process chamber, and is exhausted through exhaust ductwork into the gas box exhaust port. The gas box is coupled to an associated gas panel, e.g., gas panel 112A, and can also be coupled to the control unit 66. The other gas box 116 and associated gas panel 116A correspond to the other vertical furnace 12. Those of ordinary skill will recognize that the two gas boxes can be replaced by a single gas box.

The gas introducing pipe allows the passage of a selected process gas into the process chamber 108. Various process gases can be introduced into the process chamber to dispose selected films upon the semiconductor wafers. For example, oxygen can be introduced into the chamber to form an oxide film, $SiH_4$ can be introduced for forming a polysilicon film, and $NH_4$ and $SiH_2Cl_2$ can be introduced to form a silicon nitride film. Moreover, a purge gas such as nitrogen can be selectively introduced to the process chamber 108 to remove air therefrom. As is known, the presence of air in the process chamber during the high temperature processing and annealing of the semiconductor wafers disposes a relatively thick and poor quality oxide film upon the semiconductor wafers. In addition, a cleaning gas for removing a natural oxidation film from the wafers can be introduced into the process chamber 108. The cleaning gas can be, for example, a plasmaless etching gas such as $NF_3$ and HCl, a reducing gas such as hydrogen, or other appropriate gases. The gas introducing pipe can be formed at an upper or lower portion of the heating sleeve 100, or can be similarly mounted to the wafer transport assembly 54. An exhaust pipe is similarly formed in the heating sleeve or wafer transport assembly to selectively purge the process chamber 108 of the introduced gas. Hence, the gas disposed within the heating sleeve can be exhausted through the exhaust pipe, thereby setting the inside of the heating sleeve to a predetermined degree of vacuum, or to remove the gas which has been previously introduced via the gas introducing pipes.

The gas introduced into the process chamber during heating is preferably decomposed by the high temperature environment and deposits upon the exposed surfaces of the semiconductor wafers. Consequently, the gases are introduced into the process chamber in preselected quantities to dispose a film having a selected thickness on the wafer.

In operation, the mechanical transport arm 36A of the mechanical transport assembly 36 is feedback controlled by the robot controller 82 to selectively place a wafer on or remove a wafer from the wafer cassette 24 or the wafer boat 40. According to one practice, while the vertical position of the wafer support assembly is varied, the mechanical transport arm 36A loads the wafer boat 40 with a wafer batch, which includes a selected number of wafers to be processed. As mentioned above, the batch size is generally about half the size of conventional wafer batches. The transport arm 36A loads the wafer boat 40 by removing wafers from selected wafer cassettes 24. Once the wafer boat 40 has been loaded, the motion controller stage 68 of the control unit 66 outputs a selected signal to the servomotor 64 to lower the heating sleeve 100 along the guide rod 60 until the flange 100C located at the open end 100B of the sleeve 100 sealingly engages and mates with the flange plate 54B of the wafer transfer assembly 54. Alternatively, the servomotor can raise the flange plate of the wafer assembly unit until it sealingly engages the heating sleeve flange 100C. If desired, a selected gas is introduced to the loadlock process chamber 108 formed by the heating sleeve 100 and the wafer support assembly. The heating sleeve 100 and/or wafer support assembly 54 are then selectively raised and introduced to the heating chamber 46 of the process tube 44. The wafer batch is heated by the heating elements to a selected process temperature depending upon the particular process technique to be performed, and at a relatively accelerated temperature ramp-up rate. The process gas is supplied to form a film on the wafer.

After a user selected duration in the isothermal heating zone of the furnace 14, the sleeve and transport assembly 54 are lowered and removed from the heating chamber 46. The wafers are left in the loadlock process chamber 108 where they are cooled at a relatively fast temperature ramp-down rate. The wafer temperature is decreased by radiation cooling (although direct cooling techniques can also be employed) until the temperature of the wafers attains a desired value, e.g., 50° C. or less. After the wafers are cooled, the computer 74 actuates the servomotor 64 to raise the heating sleeve 100 relative to the wafer support assembly 54 to break or disengage the sealing engagement therebetween. The processed wafers stored on the wafer boat 40 are then successively removed by the wafer transfer assembly and conveyed to the wafer cassettes.

Because of the smaller batch sizes of the wafer boats as well as the increased wafer pitch, the temperature ramp-up and ramp-down rates are significantly enhanced. For example, significant increases in the temperature ramp-up rates can be achieved and approach or exceed 100° C. per minute. Likewise, the temperature ramp-down rates are further enhanced and approach or exceed 50° C. per minute. For practical applications, however, a ramp-up rate between about 30° C. and about 75° C. per minute and a temperature ramp-down rate of about 15° C. per minute and about 40° C.

per minute are sufficient. These increased ramp-up and ramp-down temperature rates significantly increase the throughput of the thermal processing furnace 10 by significantly reducing the overall batch processing time. The temperature ramp-down rates can be further influenced by the introduction of a cooling jet stream that flows across the surfaces of the wafers to remove heat therefrom. For example, a non-oxidizing inert gas such as nitrogen can be introduced to the chamber 108, or in the situation where the sleeve 100 has been disengaged from the wafer transport assembly 54 applied directly across the wafers, to further shorten the wafer cooling time. FIG. 2 thus illustrates a wafer support assembly 54 and a heating sleeve 100 which are selectively disposable within a heating chamber 46 of a furnace. Although not shown, similar heating and processing structure exists and is associated with the vertical furnace 12. For example, the vertical furnace 12 includes a process tube 44 surrounded by selected heating elements. A selectively vertically movable heating sleeve 100 and wafer transport assembly 54 are also associated therewith and selectively disposable within the process tube.

The present invention thus utilizes a single host computer (or a plurality of integrated control stages, FIG. 2) and a wafer transfer assembly to selectively load a pair of wafer boats which are individually and independently movable into and out of a corresponding vertical furnace 12, 14. The thermal processing furnace 10 of the present invention thus houses a pair of process tubes, a pair of heating sleeves, and a pair of wafer support assemblies 54. The vertical furnaces 12, 14 are further selectively disposed relative to each other, as shown in FIGS. 1 and 3, in an asymmetrical configuration to minimize the overall dimensions of the furnace 10 and to thus provide a relatively small footprint.

The thermal processing furnace of the present invention is capable of achieving enhanced temperature ramp-up and ramp-down rates without sacrificing throughput in a relatively small housing having a relatively small footprint. Because the furnace of the present invention achieves enhanced heating and cooling of the wafers, the thermal budget required for each batch is significantly reduced. This translates into significant cost savings and increased throughput.

Other advantages of the present invention include the use of dual vertical furnaces that are capable of performing, if desired, two separate semiconductor processing techniques on individual wafer batches independent of each other in each furnace. For example, an oxide film can be formed on one batch of wafers in one of the furnaces while a polysilicon film can be deposited on the other batch in the other furnace. This multi-processing multiple furnace setup in a single housing provides for a relatively flexible thermal processing furnace that enjoys significant advantages over heretofore known thermal processing furnaces. Furthermore, the use of dual furnaces in a single housing arrangement reduces the overall processing time of the wafers, thereby increasing the throughput of the system. For example, one wafer batch can be processed while the other wafer batch, disposed in the other furnace, can be cooled, unloaded and another wafer batch loaded. This dual furnace arrangement can thereby cut the total processing time of the wafer batches by as much as 25%, or greater, while concomitantly reducing operator interface requirements.

The dual vertical furnace arrangement, which is incorporated into one package and which minimizes floor space, allows the dual furnaces to share a single wafer mechanical transport assembly. This results in a more efficient use of the transport assembly, since in conventional systems it is typically used less than about 25% of the total process time.

FIG. 3 also illustrates the asymmetrical arrangement of the furnaces 12, 14 of the present invention. The dual vertical furnaces 12, 14, if symmetrically placed within the housing 16, e.g., would be symmetrical about boundary line 47 and colinear along axis 49. This arrangement would provide for a larger housing footprint. By moving one of the furnaces away from axis 49 and asymmetrically arranging the furnace within the housing, e.g., the furnaces are no longer symmetrical about boundary line 47, the housing footprint is reduced by an amount corresponding to the overlap A of the two furnaces 12, 14. This smaller footprint provides significant advantages since the furnaces are typically mounted in clean rooms where the cost per square foot is significant. Hence, reducing the size of the thermal processing apparatus means it occupies less clean room space, allowing more thermal processing furnaces to be installed therein. This improves the efficiency and throughput of the facility, while concomitantly reducing costs.

According to one practice, the vertical furnaces have a width of about 40 inches. If the furnaces were arranged along axis 49, the furnaces themselves would occupy at least 80 inches along the width of the housing 16. When the furnaces 12, 14 are asymmetrically arranged, as shown, the overlap A can be about 8 inches, thereby reducing the space occupied by the furnaces along the width of housing by as much as 10%, or even greater in other arrangements. Those of ordinary skill will appreciate that other asymmetrical arrangements of the furnaces exist, and are deemed to form part of the present specification.

The asymmetrical arrangement of the furnaces 12, 14 also optimizes the use of the single wafer transport assembly 36 by allowing the assembly to be disposed at a convenient location to service both vertical furnaces.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A vertical semiconductor wafer processing furnace, comprising vertical heating means extending along a longitudinal axis including means forming a heat processing chamber for heating semiconductor wafers, wafer support means for axially mounting a selected number of semiconductor wafers, a heating sleeve having a closed end and capable of being selectively moved into and out of said heat processing chamber and defining a loadlock processing chamber and being selectively disposable over said wafer support means, said heating sleeve being adapted to control the environment within said loadlock processing chamber and about said wafer support means exclusive of the environment of said heat processing chamber, and translation means for selectively moving at least one of said heating sleeve and said wafer support means independently of each other along said longitudinal axis.

2. The furnace of claim 1 further comprising control means coupled to one of said translation means and said heating sleeve for selectively, independently controlling the movement of said heating sleeve and said wafer support means.

3. The furnace of claim 1 further comprising control means for controlling the fluid environment of said loadlock processing chamber.

4. The furnace of claim 1 wherein said heating sleeve is adapted to sealingly engage said wafer support means to form said processing chamber.

5. The furnace of claim 1 wherein said wafer support means further includes seal means for forming a substantially fluid-tight seal with said heating sleeve when said sleeve is disposed over said wafer support means and engages said seal means.

6. The furnace of claim 5 wherein said seal means includes a flange.

7. The furnace of claim 1 further comprising control means for generating a position signal, said translation means moving one of said wafer support means and said heating sleeve in response to said position signal.

8. The furnace of claim 1 further including means for evacuating said processing chamber of said heating sleeve, and means for introducing a selected fluid into said chamber.

9. The furnace of claim 1 wherein said vertical heating means includes a process tube and a heating element at least partly surrounding the process tube.

10. The furnace of claim 9 wherein said vertical heating means comprises first and second vertically extending furnaces.

11. A vertical semiconductor wafer processing furnace, comprising
    vertical heating means extending along a longitudinal axis including means forming a heat chamber for heating semiconductor wafers,
    a wafer boat for axially mounting a selected number of semiconductor wafers,
    a heating sleeve defining a processing chamber and capable of being selectively moved into and out of said heat chamber, said heating sleeve being selectively disposable over said wafer boat, said heating sleeve being adapted to sealingly engage said wafer boat to form said processing chamber, and
    translation means for selectively moving at least one of said heating sleeve and said wafer boat along said longitudinal axis into said heating chamber.

12. A vertical semiconductor wafer processing furnace, comprising
    vertical heating means extending along a longitudinal axis including means forming a heat chamber for heating semiconductor wafers,
    wafer support means for axially mounting a selected number of semiconductor wafers,
    a heating sleeve defining a processing chamber and capable of being selectively moved into and out of said heat chamber, said heating sleeve being selectively disposable over said wafer support means, and
    translation means for selectively moving at least one of said heating sleeve and said wafer support means along said longitudinal axis into said heating chamber,
    wherein said wafer support means further includes seal means for forming a substantially fluid-tight seal with said heating sleeve when said sleeve is disposed over said wafer support means and engages said seal means.

13. The furnace of claim 12 further comprising control means coupled to one of said translation means and said heating sleeve for selectively, independently controlling the movement of one of said heating sleeve and said wafer support means.

14. The furnace of claim 12 further comprising control means for controlling the fluid environment of said processing chamber.

15. The furnace of claim 12 wherein said seal means includes a flange.

16. The furnace of claim 12 further comprising control means for generating a position signal, said translation means moving one of said wafer support means and said heating sleeve in response to said position signal.

17. The furnace of claim 12 further comprising means for evacuating said processing chamber of said heating sleeve, and means for introducing a selected fluid into said chamber.

18. The furnace of claim 12 wherein said vertical heating means includes a process tube and a heating element at least partly surrounding the process tube.

19. The furnace of claim 18 wherein said vertical heating means further comprises first and second vertically extending furnaces.

20. A vertical semiconductor wafer processing furnace, comprising a single housing having
    a first vertical furnace extending along a first longitudinal axis including means forming a first heating chamber for heat treating one or more semiconductor wafers,
    a second vertical furnace extending along a second longitudinal axis including means forming a second heating chamber for heat treating one or more semiconductor wafers,
    a first wafer support assembly including first support means for axially mounting said semiconductor wafers,
    a second wafer support assembly including second support means for axially mounting said semiconductor wafers,
    a first heating sleeve insertable into said first heating chamber and being selectively disposable over said first wafer support assembly,
    a second heating sleeve insertable into said second heating chamber and being selectively disposable over said second wafer support assembly,
    first translation means associated with said first wafer support structure for moving said first support means along said first longitudinal axis in response to a first position signal, and
    second translation means associated with said second wafer support structure for moving said second support means along said second longitudinal axis in response to a second position signal,
    wafer transfer means associated with said first and second support means for selectively transferring semiconductor wafers to or from at least one of said first and second support means, and
    control means for generating said first and second position signals and for transferring said position signals to said first and second translation means.

21. A method for processing a semiconductor wafer, comprising
    providing a vertical furnace extending along a longitudinal axis and forming a heat processing chamber for heating the semiconductor wafer,
    providing a wafer support assembly for axially mounting a selected number of the semiconductor wafers,
    providing a movable heating sleeve having a closed end and being insertable into and out of said heat processing chamber and defining a loadlock processing chamber and being selectively disposable over said wafer support means, said heating sleeve being adapted to control the environment within said loadlock processing chamber and about said wafer support means exclusive of the environment of said heat processing chamber, and selectively moving at least one of said heating sleeve and said wafer support means along said longitudinal axis into said heating chamber.

22. A vertical semiconductor wafer processing furnace, comprising vertical heating means extending along a longitudinal axis including means forming a heat processing chamber for heating semiconductor wafers, wafer support means for axially mounting a selected number of semiconductor wafers, a heating sleeve having a closed end insertable into said heat processing chamber and defining a loadlock processing chamber and being selectively disposable over said wafer support means, said heating sleeve being adapted to control the environment within said loadlock processing chamber and about said wafer support means exclusive of the environment of said heat processing chamber, translation means for selectively moving at least one of said heating sleeve and said wafer support means along said longitudinal axis into said heat processing chamber, and control means for generating a position signal, said translation means moving one of said wafer support means and said heating sleeve in response to said position signal.

23. The furnace of claim 22, wherein said control means is coupled to one of said translation means and said heating sleeve for selectively, independently controlling the movement of one of said heating sleeve and said wafer support means.

24. The furnace of claim 22, wherein said control means comprises means for controlling the fluid environment of said loadlock processing chamber.

25. The furnace of claim 22, wherein said heating sleeve is adapted to sealingly engage said wafer support means to form said processing chamber.

26. The furnace of claim 22, wherein said wafer support means further comprises seal means for forming a substantially fluid-tight seal with said heating sleeve when said sleeve is disposed over said wafer support means and engages said seal means.

27. The furnace of claim 22, further comprising means for evacuating said processing chamber of said heating sleeve, and means for introducing a selected fluid into said chamber.

28. The furnace of claim 22, wherein said vertical heating means comprises a process tube and a heating element at least partly surrounding the process tube.

29. The furnace of claim 22, wherein said vertical heating means comprises first and second vertically extending furnaces.

30. A vertical semiconductor wafer processing furnace, comprising vertical heating means extending along a longitudinal axis including means forming a heat chamber for heating semiconductor wafers, wafer support means for axially mounting a selected number of semiconductor wafers, a heating sleeve defining a processing chamber and being selectively disposable over said wafer support means, translation means for selectively moving at least one of said heating sleeve and said wafer support means along said longitudinal axis into said heating chamber, and control means for generating a position signal, said translation means moving one of said wafer support means and said heating sleeve in response to said position signal, wherein said wafer support means further includes seal means for forming a substantially fluid-tight seal with said heating sleeve when said sleeve is disposed over said wafer support means and engages said seal means.

31. The furnace of claim 30, wherein said control means is coupled to one of said translation means and said heating sleeve for selectively, independently controlling the movement of one of said heating sleeve and said wafer support means.

32. The furnace of claim 30, wherein said control means comprises means for controlling the fluid environment of said processing chamber.

33. The furnace of claim 30, wherein said seal means comprises a flange.

34. The furnace of claim 30, further comprising means for evacuating said processing chamber of said heating sleeve, and means for introducing a selected fluid into said chamber.

35. The furnace of claim 30, wherein said vertical heating means comprises a process tube and a heating element at least partly surrounding the process tube.

36. The furnace of claim 30, wherein said vertical heating means farther comprises first and second vertically extending furnaces.

* * * * *